United States Patent
Szczypinski

(10) Patent No.: US 8,756,393 B2
(45) Date of Patent: Jun. 17, 2014

(54) CONTROL CIRCUIT IN A MEMORY CHIP

(75) Inventor: Kazimierz Szczypinski, Munich (DE)

(73) Assignee: Qimonda AG, Munich (DE)

( * ) Notice: Subject to any disclaimer, the term of this patent is extended or adjusted under 35 U.S.C. 154(b) by 1137 days.

(21) Appl. No.: 12/262,124

(22) Filed: Oct. 30, 2008

(65) Prior Publication Data

US 2009/0119472 A1    May 7, 2009

(30) Foreign Application Priority Data

Oct. 30, 2007  (DE) .................. 10 2007 051 839

(51) Int. Cl.
*G06F 12/00*    (2006.01)

(52) U.S. Cl.
USPC ............. 711/167; 711/154; 711/E12.001; 713/600

(58) Field of Classification Search
None
See application file for complete search history.

(56) References Cited

U.S. PATENT DOCUMENTS

| | | | | |
|---|---|---|---|---|
| 3,505,478 A * | 4/1970 | Kaneko | ................. | 370/518 |
| 4,152,719 A * | 5/1979 | Kellar | ................. | 348/580 |
| 4,882,712 A * | 11/1989 | Ohno et al. | ................. | 365/206 |
| 5,347,559 A * | 9/1994 | Hawkins et al. | ................. | 713/502 |
| 5,568,445 A * | 10/1996 | Park et al. | ................. | 365/194 |
| 6,067,632 A * | 5/2000 | Yamaguchi | ................. | 711/105 |
| 6,134,155 A * | 10/2000 | Wen | ................. | 365/189.04 |
| 6,243,797 B1 * | 6/2001 | Merritt | ................. | 711/167 |
| 6,337,830 B1 * | 1/2002 | Faue | ................. | 365/230.04 |
| 6,917,562 B2 * | 7/2005 | Schaefer et al. | ................. | 365/194 |
| 6,975,131 B2 * | 12/2005 | Szczypinski et al. | ................. | 324/750.3 |
| 7,304,515 B2 * | 12/2007 | Brox et al. | ................. | 327/158 |
| 2001/0027507 A1 * | 10/2001 | Merritt | ................. | 711/105 |
| 2001/0039602 A1 * | 11/2001 | Kanda et al. | ................. | 711/105 |
| 2001/0044888 A1 * | 11/2001 | Li et al. | ................. | 711/167 |
| 2001/0046167 A1 * | 11/2001 | Ayukawa et al. | ................. | 365/200 |
| 2002/0018395 A1 * | 2/2002 | McLaury | ................. | 365/233 |
| 2002/0021617 A1 * | 2/2002 | Toda et al. | ................. | 365/233 |
| 2002/0093871 A1 * | 7/2002 | Kwak | ................. | 365/233 |
| 2003/0088753 A1 * | 5/2003 | Ikeda et al. | ................. | 711/202 |
| 2003/0117864 A1 * | 6/2003 | Hampel et al. | ................. | 365/200 |
| 2003/0126356 A1 * | 7/2003 | Gustavson et al. | ................. | 711/105 |
| 2003/0172240 A1 * | 9/2003 | Johnson | ................. | 711/167 |
| 2004/0120189 A1 * | 6/2004 | Schauer | ................. | 365/189.01 |
| 2004/0218461 A1 * | 11/2004 | Park | ................. | 365/233 |

(Continued)

FOREIGN PATENT DOCUMENTS

| DE | 102004033387 | 2/2006 |
|---|---|---|
| DE | 102006020857 | 11/2006 |

(Continued)

OTHER PUBLICATIONS

Vlachos, Evaggelos. "Design and Implementation of a Coherent Memory Sub-System for Shared Memory Multiprocessors." Foundation for Research and Technology—Hellas. Technical Report FORTH-ICS/TR-382, Jul. 2006.*

*Primary Examiner* — Matthew Bradley
*Assistant Examiner* — Daniel Bernard
(74) *Attorney, Agent, or Firm* — Patterson & Sheridan, LLP

(57) ABSTRACT

Embodiments of the invention relate to a control circuit comprising a clock signal connection for receiving a system clock signal, a write signal connection for receiving a write signal, and a write control circuit for executing write commands, wherein the write control circuit is designed to start executing a write command when a write signal is applied to the write signal connection during an edge of the system clock signal.

14 Claims, 3 Drawing Sheets

(56) References Cited

U.S. PATENT DOCUMENTS

| | | |
|---|---|---|
| 2006/0018165 A1 | 1/2006 | Szczypinski |
| 2006/0250883 A1 | 11/2006 | Szczypinski |
| 2007/0070793 A1 | 3/2007 | Do |
| 2007/0140510 A1* | 6/2007 | Redmann .................. 381/97 |
| 2008/0080492 A1* | 4/2008 | Pyeon et al. .................. 370/389 |
| 2008/0253205 A1* | 10/2008 | Park .................. 365/189.16 |
| 2009/0089538 A1* | 4/2009 | Yeh et al. .................. 711/211 |

FOREIGN PATENT DOCUMENTS

| | | | |
|---|---|---|---|
| DE | 102006030373 | 4/2007 | |
| EP | 1298667 | 4/2003 | |
| JP | H01-171337 A * | 7/1989 | ............... H04L 7/00 |

* cited by examiner

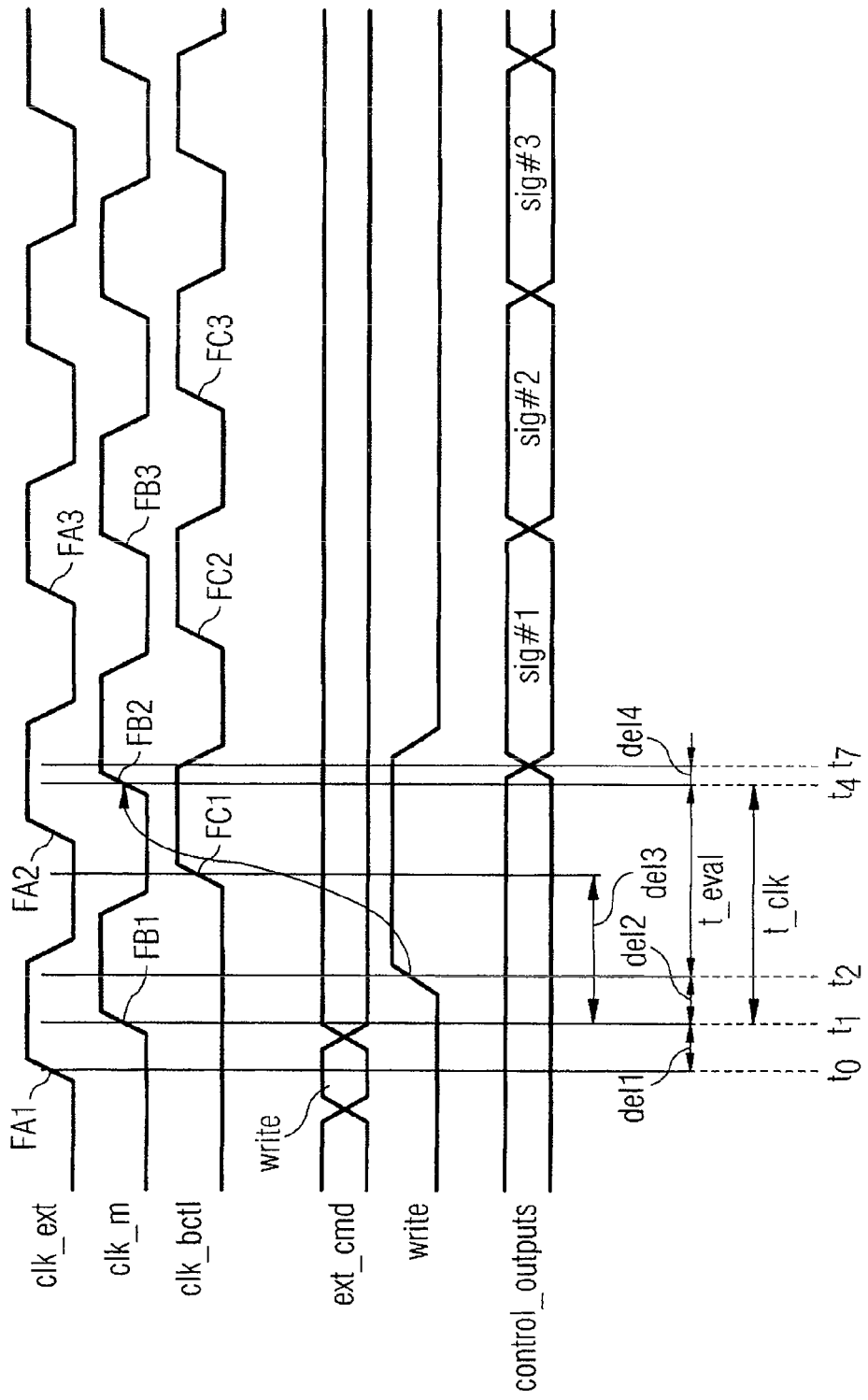

CONTROL CIRCUIT IN A MEMORY CHIP

CROSS-REFERENCE TO RELATED APPLICATIONS

This application claims foreign priority benefits under 35 U.S.C. §119 to co-pending German patent application number DE 10 2007 051 839.2-55, filed 30 Oct. 2007. This related patent application is herein incorporated by reference in its entirety.

BACKGROUND TO THE INVENTION

1. Field of the Invention

The invention relates to a memory apparatus having a control circuit, to a method for performing a write command in a memory apparatus having a control circuit, and to a method for operating a memory apparatus having a control circuit.

2. Description of the Relevant Prior Art

Memory apparatuses having a multiplicity of memory cells which are selectively addressable (RAM=Random Access Memory) are used in many portable and non-portable devices today in order to store and read information. By way of example, dynamic RAMs (DRAMs) are used as main memories in computers. Memory apparatuses of this generic type are usually manufactured as integrated chips on a semiconductor substrate. DDR2-SDRAMs and DDR3-SDRAMs are modern forms of DRAM memory apparatuses. Herein, DRAM memory apparatuses based on one of the standards DDR2, DDR3 or a further development of one of these standards are referred to as "DDR2-SDRAM or above".

To allow rapid writing or reading of a plurality of data values to successive memory areas of a memory chip or from successive memory areas of a memory chip, DDR2-SDRAMs or above support what is known as burst access. Such burst access starts at a stipulated memory address and accesses four or eight data values in a stipulated order.

SUMMARY OF THE INVENTION

One embodiment of the invention provides a control circuit having a clock signal connection for receiving a system clock signal, a write signal connection for receiving a write signal, and a write control circuit for executing write commands. The write control circuit is designed to start executing a write command when a write signal is applied to the write signal connection during an edge of the system clock signal.

Another embodiment of the invention relates to a memory apparatus having a control circuit, the control circuit having a clock signal connection for receiving a system clock signal, a write signal connection for receiving a write signal, and a write control circuit for executing write commands. The write control circuit is designed to start executing a write command when a write signal is applied to the write signal connection during an edge of the system clock signal.

Another embodiment of the invention relates to a method for performing a write command in a memory apparatus having a control circuit. The method comprises executing a write command at the time at which an edge of the system clock signal appears, and outputting output signals which are in synch with the internal system clock signal and which are delayed in comparison with the system clock signal by a stipulated period, via the output signal connections.

Another embodiment of the invention relates to a method for operating a memory apparatus having a control circuit, wherein read commands and write commands are executed in different clock domains.

BRIEF DESCRIPTION OF THE FIGURES

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 illustrates a schematic clock signal diagram for a burst control circuit.

DETAILED DESCRIPTION

Figure 1:
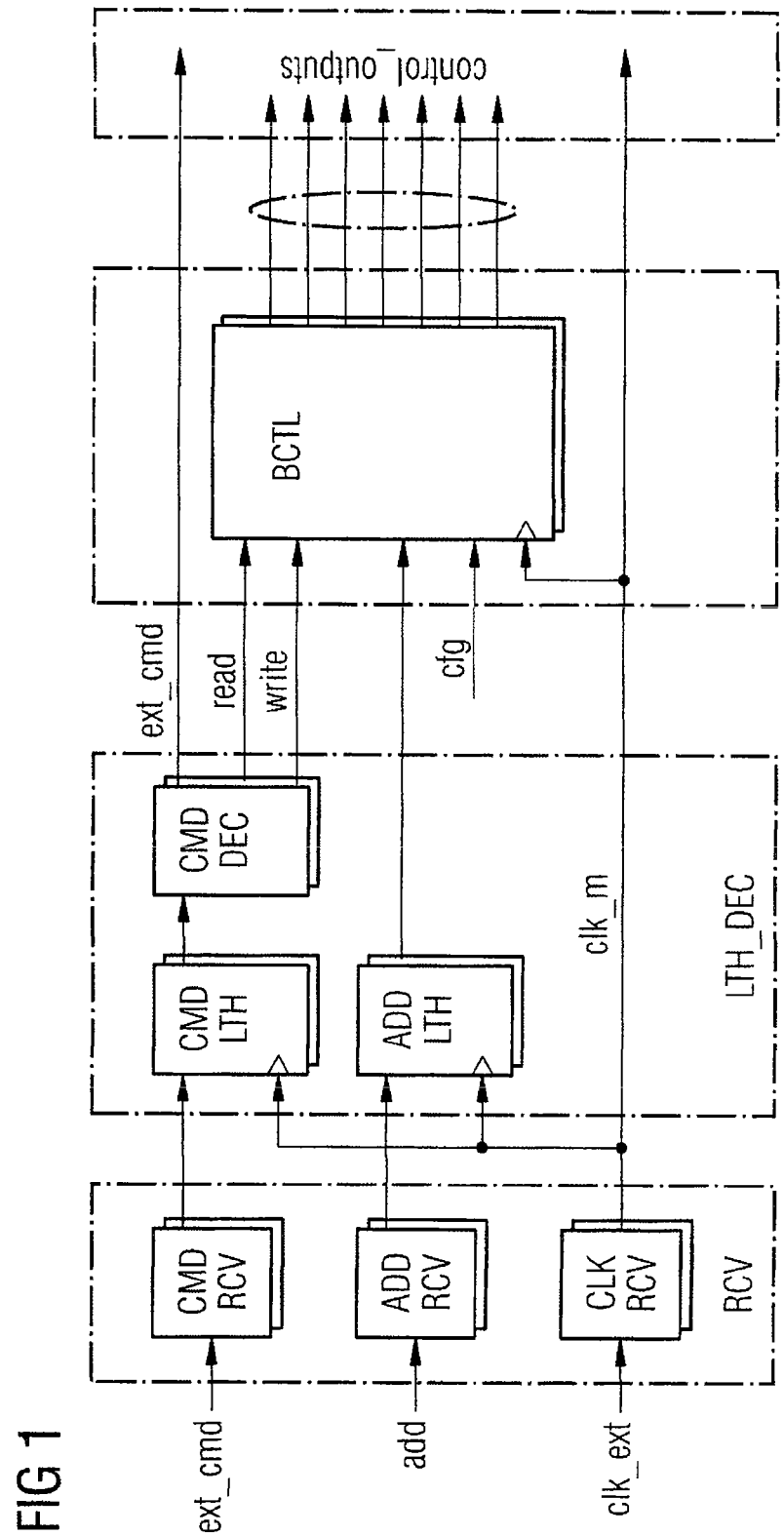
FIG. 1 illustrates a schematic block diagram of a detail from a memory chip of the type DDR2-SDRAM or above with a burst control circuit which is responsible for controlling a burst access operation.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Also, signal names used below are exemplary names, indicative of signals used to perform various functions in a given memory device. In some cases, the relative signals may vary from device to device. Furthermore, the circuits and devices described below and depicted in the figures are merely exemplary of embodiments of the invention. As recognized by those of ordinary skill in the art, embodiments of the invention may be utilized with any memory device.

Embodiments of the invention may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

In both situations, where the memory is integrated into a device with other circuits and where the memory is provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including other devices with the same type of memory, other devices with different types of memory, and/or other devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments of the invention may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (Fe-RAM), phase-change RAM (PRAM), electrically erasable programmable read-only memory (EEPROM), laser programmable fuses, electrically programmable fuses (e-fuses), and any other types of nonvolatile memory.

FIG. 1 schematically shows a detail from a DDR2-SDRAM or above, according to one embodiment. However, the application of the invention is not limited to DDR2-SDRAM or above.

FIG. 1 shows a reception device RCV which may comprise a command reception device CMD_RCV, an address reception device ADD_RCV and a clock reception device CLK_RCV.

The command reception device CMD_RCV may have first connections for a plurality of first command signal lines which the command reception device CMD_RCV may use to accept a command signal, "ext_cmd". In addition, the command reception device CMD_RCV may have second connections for a plurality of second command signal lines which may be used to transfer the received command signal ext_cmd to downstream circuit parts.

The address reception device ADD_RCV may have first connections for a plurality of first address signals lines which the address reception device ADD_RCV may use to receive a piece of address information, "add". In addition, the address reception device ADD_RCV may have second connections for a plurality of second address signal lines which may be used to transfer the received address information add to downstream circuit parts.

The clock reception device CLK_RCV may have a first connection for a first clock signal line which the clock reception device CLK_RCV may use to receive an external clock signal clk_ext. From the external clock signal clk_ext, the clock reception device CLK_RCV may generate an internal system clock signal clk_m which may be delayed in comparison with the external clock signal clk_ext by a stipulated delay time del1. The clock reception device CLK_RCV may have a second connection for a second clock signal line which may be used to output the generated internal system clock signal clk_m.

In addition, FIG. 1 shows a buffer and decoding device LTH_DEC which may comprise a command latch CMD_LTH, a command decoder CMD_DEC and an address latch ADD_LTH.

The command latch CMD_LTH may have first connections for a plurality of first command signal lines which the command latch CMD_LTH may use to accept a command signal ext_cmd from the command reception device CMD_RCV. In addition, the command latch CMD_LTH may have second connections for a plurality of second command signal lines which may be used to transfer the command signal ext_cmd to downstream circuit parts. The command latch CMD_LTH may also have a connection for a clock signal line which the command latch CMD_LTH may use to receive an internal system clock signal clk_m generated by the clock reception device CLK_RCV. The command latch CMD_LTH may allow a command signal ext_cmd received via the first signal lines to be buffer-stored and to be output via the second signal lines in synch with the internal system clock signal clk_m applied to the clock signal line.

The address latch ADD_LTH may have first connections for a plurality of first address signal lines which the address latch ADD_LTH may use to accept a piece of address information add from the address reception device ADD_RCV. In addition, the address latch ADD_LTH may have second connections for a plurality of second address signal lines which may be used to transfer the address information add to downstream circuit parts. The address latch ADD_LTH may also have a connection for a clock signal line which the address latch ADD_LTH may use to receive an internal system clock signal clk_m generated by the clock reception device CLK_RCV. The address latch ADD_LTH may allow a piece of address information add received via the first signal lines to be buffer-stored and to be output via the second signal lines in synch with the internal system clock signal clk_m applied to the clock signal line.

The command decoder CMD_DEC may have first connections for a plurality of first command signal lines which the command decoder CMD_DEC may use to accept a command signal ext_cmd from the command latch CMD_LTH. In addition, the command decoder CMD_DEC may have second connections for a plurality of second command signal lines which may be used to transfer the command signal ext_cmd to downstream circuit parts. The command decoder CMD_DEC may also have a connection for a read signal line which the command decoder CMD_DEC may use to output a read signal, "read". In addition, the command decoder CMD_DEC may have a connection for a write signal line which the command decoder CMD_DEC may use to output a write signal, "write".

The command decoder CMD_DEC may decode the received command signal ext_cmd. If the received command is a read command, the command decoder CMD_DEC may output a read signal read on the read signal line. If the received command is a write command, the command decoder CMD_DEC may output a write signal write on the write signal line.

In addition, FIG. 1 schematically shows a burst control circuit BCTL. The burst control circuit BCTL may have connections for a read signal line and a write signal line which the burst control circuit BCTL may use to receive a read or write signal generated by the command decoder CMD_DEC. In addition, the burst control circuit BCTL may have connections for a plurality of address signal lines which the burst control circuit BCTL may use to accept a piece of address information (add) from the address latch ADD_LTH. The burst control circuit BCTL may also have a connection for a clock signal line which the burst control circuit BCTL may use to receive an internal system clock signal clk_m generated by the clock reception device CLK_RCV. In addition, the burst control circuit BCTL may have a connection for a configuration signal line which the burst control circuit BCTL may use to receive a piece of configuration information cfg. The burst control circuit BCTL may also have connections for a plurality of output signal lines which the burst control circuit BCTL may use to transfer output signals, "control_outputs", to downstream circuit parts of the memory chip.

The burst control circuit BCTL may first evaluate a received read or write command. This may involve the burst control circuit BCTL logically combining the command with a bank address, calculating the destination addresses of the read or write command and checking whether the received command can be, and is permitted to be, executed. Next, the burst control circuit BCTL may start to execute the received read or write command. This may involve the burst control circuit BCTL generating output signals control_outputs which may be transferred via the plurality of output signal lines to downstream circuit parts of the memory chip. In the downstream circuit parts of the memory chip, the output signals control_outputs from the burst control circuit BCTL may prompt activation of a further downstream receiver circuit. Next, a preamble may be output or received, depending on whether a read or write command is being performed. In addition, the output signals control_outputs from the burst control circuit BCTL may prompt selection of a data path for the data which is to be read or to be written.

Figure 2:
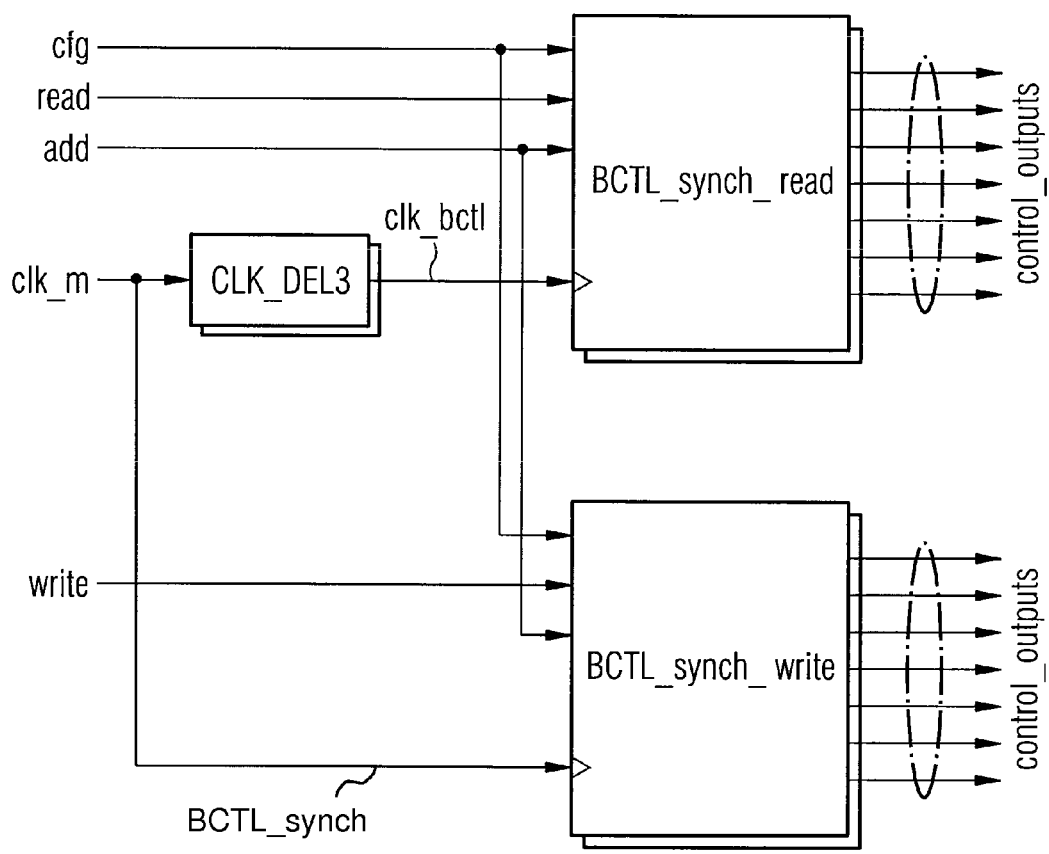
FIG. 2 illustrates a schematic block diagram of a burst control circuit.

One embodiment of the burst control circuit BCTL in FIG. 1 is provided by the burst control circuit BCTL_synch shown in FIG. 2. The burst control circuit BCTL_synch may have a write control circuit, BCTL_synch_write, a read control circuit, BCTL_synch_read, and a delay circuit, CLK_DEL3. In one embodiment of the invention, the processing of the read and write commands may be separated in the burst control circuit BCTL_synch of the memory chip in order to process read and write commands in different clock domains.

The delay circuit CLK_DEL3 may have a first connection for a first clock signal line which the delay circuit CLK_DEL3 may use to receive an internal system clock signal clk_m. From the internal system clock signal clk_m, the delay circuit CLK_DEL3 may generate an internal burst clock signal clk_bctl, which may be delayed in comparison with the internal system clock system clk_m by a stipulated burst clock delay time del3. The delay circuit CLK_DEL3 may have a second connection for a second clock signal line which may be used to output the generated internal burst clock signal clk_bctl.

The write control circuit BCTL_synch_write and the read control circuit BCTL_synch_read may have respective connections for a plurality of address signal lines which the write control circuit BCTL_synch_write and the read control circuit BCTL_synch_read may use to accept a piece of address information add from the address latch ADD_LTH. The read control circuit BCTL_synch_read may have a connection for a clock signal line which the read control circuit BCTL_synch_read may use to receive the internal burst clock signal clk_bctl generated by the delay circuit CLK_DEL3.

The write control circuit BCTL_synch_write may have a connection for a clock signal line which the write control circuit BCTL_synch_write may use to receive the internal system clock signal clk_m. In addition, the write control circuit BCTL_synch_write and the read control circuit BCTL_synch_read may have a respective connection for a configuration signal line which the write control circuit BCTL_synch_write and the read control circuit BCTL_synch_read may use to receive a piece of configuration information cfg. The write control circuit BCTL_synch_write and the read control circuit BCTL_synch_read may also have respective connections for a plurality of output signal lines which the write control circuit BCTL_synch_write and the read control circuit BCTL_synch_read may use to transfer output signals control_outputs to downstream circuit parts of the memory chip. In addition, the write control circuit BCTL_synch_write may have a connection for a write signal line which the write control circuit BCTL_synch_write may use to receive a write signal write generated by the command decoder CMD_DEC. The read control circuit BCTL_synch_read may also have a connection for a read signal line which the read control circuit BCTL_synch_read may use to receive a read signal read generated by the command decoder CMD_DEC. The write control circuit BCTL_synch_write and the read control circuit BCTL_synch_read may be designed as Moore machines.

The write control circuit BCTL_synch_write may execute a received write command in the clock domain of the internal system clock signal clk_m. The output signals control_outputs generated by the write control circuit BCTL_synch_write may be output in synch with the internal system clock signal clk_m. The generated output signals control_outputs may be regarded as being in synch with the internal system clock signal clk_m if the generated output signals control_outputs are delayed in comparison with the internal system clock signal clk_m by less than 25%, for example, of the length t_clk of one clock period of the internal system clock signal clk_m and therefore have a sufficiently long setup time for the next respective clock period of the system clock signal clk_m.

The read control circuit BCTL_synch_read may execute a received read command in the clock domain of the internal burst clock signal clk_bctl. The output signals control_outputs generated by the read control circuit BCTL_synch_read may be output by the read control circuit BCTL_synch_read in synch with the internal burst clock signal clk_bctl.

FIG. 3 shows an example of a schematic diagram of the timing of the signals applied to different signal lines while a write access operation is being performed in a memory chip of the type DDR2-SDRAM or above with a burst control circuit BCTL_synch, according to one embodiment.

At the time t0, a command signal ext_cmd may be applied to the first command signal lines of the command reception device CMD_RCV in the reception device RCV. At the same time, the external clock signal clk_ext applied to the first clock signal line of the clock reception device CLK_RCV in the reception device RCV may have a first rising edge FA1 which may prompt the reception device RCV to take on the command signal ext_cmd. In the example shown. In this example, the applied command signal ext_cmd is an encoded write command.

The clock reception device CLK_RCV may take the external clock signal clk_ext and generate an internal system clock signal clk_m which may be delayed in comparison with the external clock signal clk_ext by an internal clock delay time del1. The internal system clock signal clk_m therefore may have a first rising edge FB1 at a time t1, wherein $t1 = t0 + del1.$ The clock signal clk_ext may have a frequency of 500 MHz to 1 GHz, for example. The internal clock delay time del1 may be in the region of a few hundred picoseconds.

The delay circuit CLK_DEL3 may take the internal system clock signal clk_m and derive an internal burst clock signal clk_bctl which may be delayed in comparison with the internal system clock signal clk_m by the burst clock delay time del3. The burst clock delay time del3 may be in the region of one to two nanoseconds, for example.

The command reception device CMD_RCV in FIG. 1 may forward the received command signal ext_cmd and the generated internal system clock signal clk_m to the buffer and decoding device LTH_DEC. At the time at which a first rising edge FB1 of the internal system clock signal clk_m arrives, the command decoder CMD_DEC may decode the received command signal ext_cmd and output a write signal write on the write signal line. The write signal may appear on the write signal line with a delay in comparison with the first edge FB1 of the internal system clock signal clk_m by the internal command delay time del2, hence at a time t2, for which $$t2=t1+\text{del}2.$$

The internal command delay time del2 may be 500 picoseconds, for example.

Calculated from the time t2 at which the write signal write arrives onwards, the evaluation of the received write signal write in the burst control circuit BCTL_synch may require an evaluation time t_eval. In an embodiment of this invention this evaluation time t_eval is set against the first clock period of the write latency WL. The JEDEC standard provides a read latency RL of at least three clock periods for memory chips of the type DDR2-SDRAM or above:

$$RL \geq 3.$$

The write latency WL is defined by $$WL=RL-1$$

as the value of the read latency RL minus one, that is to say is at least two clock periods. During the first clock period of the write latency WL, the circuits which are downstream of the burst control circuit BCTL_synch may not yet require any output signals control_outputs. It may be enough for the burst control circuit BCTL_synch to generate output signals control_outputs from the second clock period of the write latency WL onwards. It may therefore be possible for the time required for transmitting the write command from the command latch CMD_LTH and the time t_eval required for evaluating the write command to be set against the first clock period of the write latency WL.

In the burst control circuit BCTL_synch, the evaluation of the command may conclude with a second rising edge FB2 of the internal system clock clk_m at the time t4, which may be one clock period after the time t1:

$$t4=t1+t\_\text{clk}.$$

The execution of the write command by the write control circuit BCTL_synch_write in the burst control circuit BCTL_synch may then start without further delay, that is to say in synch with the second rising edge FB2 of the internal system clock clk_m at the time t4.

The output signals control_outputs generated during the command execution by the write control circuit BCTL_synch_write in the burst control circuit BCTL_synch may appear on the plurality of output signal lines of the burst control circuit BCTL_synch with a delay by an internal output delay time del4 at a time t7, which may be calculated by $$t7=t4+\text{del}4.$$

The generated output signals control_outputs may thus be delayed in comparison with the second rising edge FB2 of the internal system clock signal clk_m merely by the internal output delay time del4.

The internal output delay time del4 may be only a fraction of the length of a clock period t_clk of the internal system clock signal clk_m. It may therefore be possible for the output signals control_outputs to be processed further in synch with the internal system clock signal clk_m. In this case, the output signals control_outputs may have a sufficiently long setup time for the respective next rising edge of the internal system clock signal clk_m.

If the burst control circuit BCTL_synch is instructed to use a higher write latency WL by the received configuration information cfg, this may be achieved by virtue of the execution of the write command by the write control circuit BCTL_synch_write in the burst control circuit BCTL_synch starting not at the time t4 upon the second rising edge FB2 of the internal system clock signal clk_m but rather at a later time upon a later edge of the internal system clock signal clk_m. The write signal write may be buffer-stored in an FIFO memory during the waiting time between the second rising edge FB2 of the internal system clock signal clk_m and the next rising edge of the internal system clock signal clk_m.

Since the output signals control_outputs from the burst control circuit BCTL_synch may be output in synch with the internal system clock signal clk_m, the output signals control_outputs may not need to be synchronized back to the internal system clock signal clk_m before further processing by downstream circuit parts. It may also not be necessary to clock downstream circuit parts with a delayed clock signal. This may greatly simplify circuit parts downstream of the burst control circuit BCTL_synch.

Since the internal output delay time del4, which indicates the delay in the output signals control_outputs in comparison with the internal system clock signal clk_m, may be only a fraction of the length of one clock period t_clk of the internal system clock signal clk_m the timing of the output signals control_outputs from the burst control circuit BCTL_synch may vary little with technological parameters. This means that a memory circuit with the burst control circuit BCTL_synch may be more resistant toward a fluctuation in technological parameters. This may allow a higher yield to be obtained when manufacturing memory circuits.

The short internal output delay time del4 may allow operation at a relatively high frequency of the external clock signal clk_ext. This may allow faster access operations to a memory chip with a burst control circuit BCTL_synch.

What is claimed is:

1. A control circuit, comprising:
   a clock signal connection for receiving a system clock signal,
   a write signal connection for receiving a write signal,
   a write control circuit for executing write commands,
      wherein the write control circuit is adapted to start executing a write command when the write signal is applied to the write signal connection at a first edge of the system clock signal,
      wherein the write control circuit comprises a plurality of configuration signal connections for receiving configuration information,
      wherein the configuration information comprises information about a set write latency, and write operations are executed within a time that is shorter than the set write latency, and
      wherein the write control circuit is adapted to use a clock period, which precedes a second edge of the system clock signal that prompts the execution of the write command, as a first clock period of the set write latency,
   a read signal connection for receiving a read signal, and a read control circuit for executing read commands,
wherein the read commands and the write commands are executed in different clock domains.

2. The control circuit according to claim 1, wherein the control circuit is adapted to control burst access operations in a memory chip.

3. The control circuit according to claim 1, further comprising a plurality of output signal connections adapted to provide output signals, and wherein the write control circuit is adapted to provide said output signals which are in synch with the system clock signal and which are delayed in comparison with the system clock signal by a predefined period.

4. The control circuit according to claim 1, wherein the write operations are executed within a time which is shorter than the set write latency by approximately one clock cycle.

5. The control circuit according to claim 1, further comprising a clock generator circuit for generating an internal burst clock signal which is delayed in comparison with the system clock signal by a predefined period.

6. The control circuit according to claim 5, wherein
the read control circuit is adapted to start executing a read command when the read signal is applied to the read signal connection during an edge of the burst clock signal, and
the read control circuit is adapted to execute the read command in synch with the burst clock signal.

7. The control circuit according to claim 5, wherein the edges of the system and burst clock signals are rising edges.

8. A memory apparatus, comprising: a control circuit, the control circuit comprising:
a clock signal connection for receiving a system clock signal,
a write signal connection for receiving a write signal,
a write control circuit for executing write commands,
wherein the write control circuit is adapted to start executing a write command when the write signal is applied to the write signal connection at a first edge of the system clock signal,
wherein the write control circuit comprises a plurality of configuration signal connections for receiving configuration information,
wherein the configuration information comprises information about a set write latency, and write operations are executed within a time shorter than the set write latency, and
wherein the write control circuit is configured to use a clock period, which precedes a second edge of the system clock signal that prompts the execution of the write command, as a first clock period of the set write latency,
a read control circuit for executing read commands, and
a read signal connection for receiving a read signal,
wherein the read control circuit and the write control circuit are configured to execute the read commands and the write commands, respectively, in different clock domains.

9. The memory apparatus according to claim 8, wherein the control circuit is adapted to control burst access operations in a memory chip.

10. The memory apparatus according to claim 8, further comprising:
a plurality of output signal connections for providing output signals, and wherein the write control circuit is adapted to provide said output signals which are in synch with the system clock signal and which are delayed in comparison with the system clock signal by a stipulated period.

11. The memory apparatus according to claim 8, wherein the write operations are executed within a time shorter than the set write latency by approximately one clock cycle.

12. The memory apparatus according to claim 8, further comprising a clock generator circuit for generating an internal burst clock signal which is delayed in comparison with the system clock signal by a stipulated period.

13. The memory apparatus according to claim 12, wherein
the read control circuit is adapted to start executing a read command when the read signal is applied to the read signal connection during an edge of the burst clock signal, and
the read control circuit is adapted to execute the read command in synch with the burst clock signal.

14. The memory apparatus according to claim 13, wherein the respective edges of the system clock signal and the burst clock signal are rising edges.

* * * * *